United States Patent
Kudo

(10) Patent No.: US 8,285,769 B2
(45) Date of Patent: Oct. 9, 2012

(54) SIGNAL PROCESSING APPARATUS AND THE CORRECTING METHOD

(75) Inventor: Masahiro Kudo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1160 days.

(21) Appl. No.: 12/010,985

(22) Filed: Jan. 31, 2008

(65) Prior Publication Data
US 2008/0201396 A1 Aug. 21, 2008

(30) Foreign Application Priority Data
Feb. 15, 2007 (JP) ................................. 2007-035438

(51) Int. Cl.
*G06F 17/10* (2006.01)
(52) U.S. Cl. ........................................................ 708/300
(58) Field of Classification Search .......... 708/300–323, 708/819
See application file for complete search history.

(56) References Cited

U.S. PATENT DOCUMENTS

| | | | |
|---|---|---|---|
| 6,954,628 B2 | 10/2005 | Minnis et al. | |
| 7,590,205 B2* | 9/2009 | Zipper | 375/350 |
| 2003/0228852 A1 | 12/2003 | Murakami et al. | |
| 2007/0132442 A1* | 6/2007 | Jones | 324/76.29 |
| 2008/0002597 A1* | 1/2008 | Fan et al. | 370/280 |

FOREIGN PATENT DOCUMENTS

| | | |
|---|---|---|
| JP | 200415409 | 1/2004 |
| JP | 2004-515104 | 5/2004 |

* cited by examiner

*Primary Examiner* — Tan V. Mai
(74) *Attorney, Agent, or Firm* — Murphy & King, P.C.

(57) ABSTRACT

A signal processing apparatus includes a first filter on an in-phase signal channel; a second filter on a quadrature signal channel; a plurality of filter stages having each of more than one signal paths crossing each other which connects the first filter and the second filter; and at least more than one of the filter stages of more than one of a plurality of the filter stages includes a switching circuit disconnecting more than one of the signal paths and a correction unit correcting direct current offsets of the first filter and the second filter by using the switching circuit.

7 Claims, 16 Drawing Sheets

SIGNAL PROCESSING APPARATUS AND THE CORRECTING METHOD

1. BACKGROUND

Figure 1:
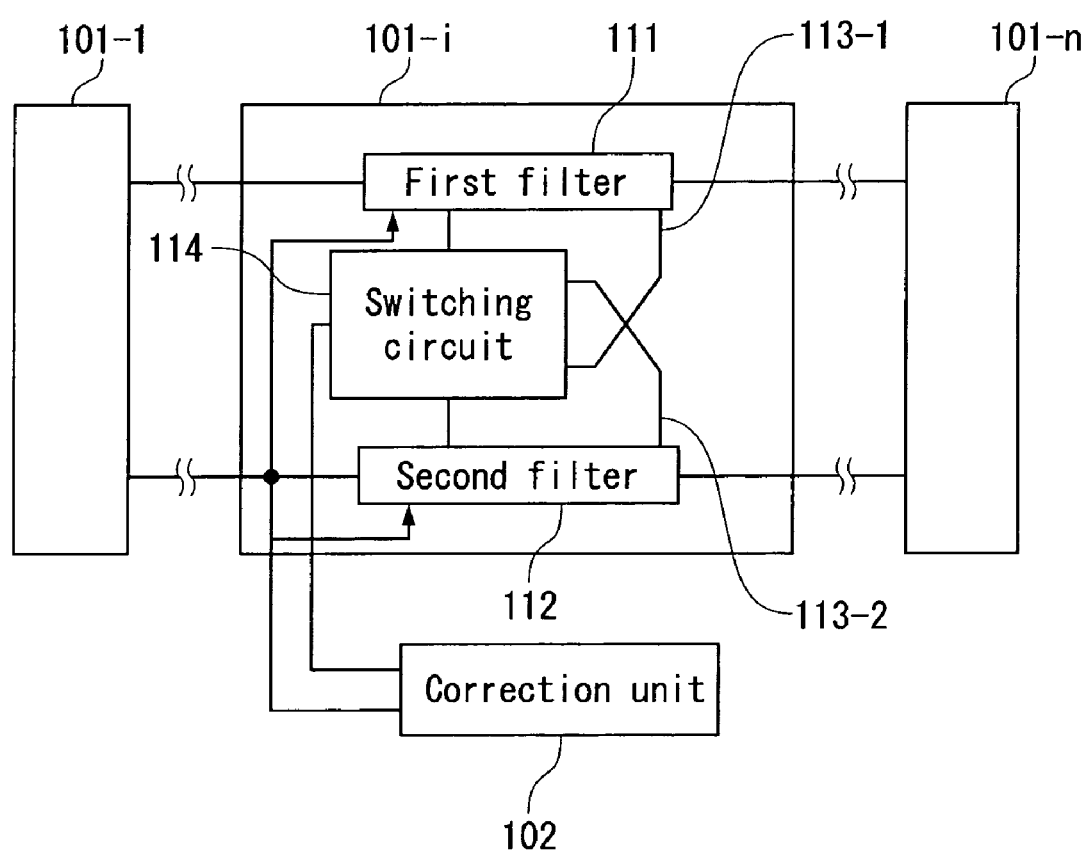

The present apparatus and method relate to an apparatus performing signal processing of complex signals, and a method of correcting direct current offsets of the apparatus.

2. DESCRIPTION OF THE RELATED ART

A complex signal expressed in a signal having an in-phase (I) signal and a quadrature (Q) signal is widely used in communication technology. Japanese Laid-Open Patent Publication No. 2004-515104 discloses that a communication system is provided with an analog signal processing circuit handling complex signals, and a complex filter is used to perform independent filter processing for each of positive and negative frequencies handled by the complex signals.

The above-described conventional complex filter has the following problem.

If a baseband analog circuit of a low IF system employs capacitive coupling to cut direct current (DC), an area of a capacitor increases as the frequency of an IF (intermediate frequency) signal becomes low. As a result, the production of the circuit becomes difficult.

3. SUMMARY

It is an object of the present apparatus and method to provide a signal processing apparatus and a correcting method which implements an increase of the area of capacitor and a difficulty of production of the circuit.

A signal processing apparatus comprises a first filter on an in-phase signal channel, a second filter on a quadrature signal channel, a plurality of filter stages having each of more than one signal paths crossing each other which connects the first filter and the second filter and at least more than one of the filter stages of more than one of a plurality of the filter stages comprises a switching circuit disconnecting more than one of the signal paths and a correction unit correcting direct current offsets of the first filter and the second filter by using the switching circuit.

The signal processing apparatus further comprises the correction unit that controls the switching circuit to disconnect more than one signal paths of the first filter stage of at least more than one of the filter stages, and corrects the direct current offset of the first filter stage and controls the switching circuit after the correction so as to connect more than one signal paths of the first filter stage, and corrects the direct current offset of the second filter stage following the first filter stage.

The signal processing apparatus further comprises the correction unit that controls the switching circuit to disconnect more than one signal paths of more than one of the filter stages, and corrects the direct offset of the correcting targeted filter stage targeting at least more than one filter stage as the beginning filter stage, and controls the switching circuit so as to connect more than one signal paths of the correction targeted filter stage after the correction and repeats correction of the direct current offset as a new correction targeted filter stage following the correction targeted filter stage.

The signal processing apparatus further comprises a monitor unit monitoring output signals of any filter stage of a plurality of the filter stages, and a control unit that determines a correction value of the direct current offset of the filter stage located before the monitored filter stage depending on the monitored output signal.

The signal processing apparatus comprises a first filter in an in-phase signal channel, a second filter in a quadrature channel, more than one signal paths crossing each other and connecting the first filter to the second filter, a switching circuit disconnecting more than one of the signal paths and a correction unit correcting direct current offsets of the first filter and the second filter by using the switching circuit.

The signal processing apparatus further comprises the correction unit that controls the switching circuit to disconnect more than one of the signal paths, and correct direct current offsets of the first filter and the second filter.

A correction method for correcting direct current offsets of a plurality of filter stages comprises a first step of connecting the first filter on the in-phase signal channel with the second filter on the quadrature signal channel, a second step of disconnecting more than one signal paths of a first filter stage of a plurality of the filter stages including each of more than one signal paths crossing each other, a third step of corrects the direct current offset of the first filter stage, a fourth step of connecting more than one of the signal paths of the first filter stage after the correction, and a fifth step of correcting the direct current offset of the second filter stage following the first filter stage.

4. BRIEF DESCRIPTION OF THE DRAWINGS

Figure 2:
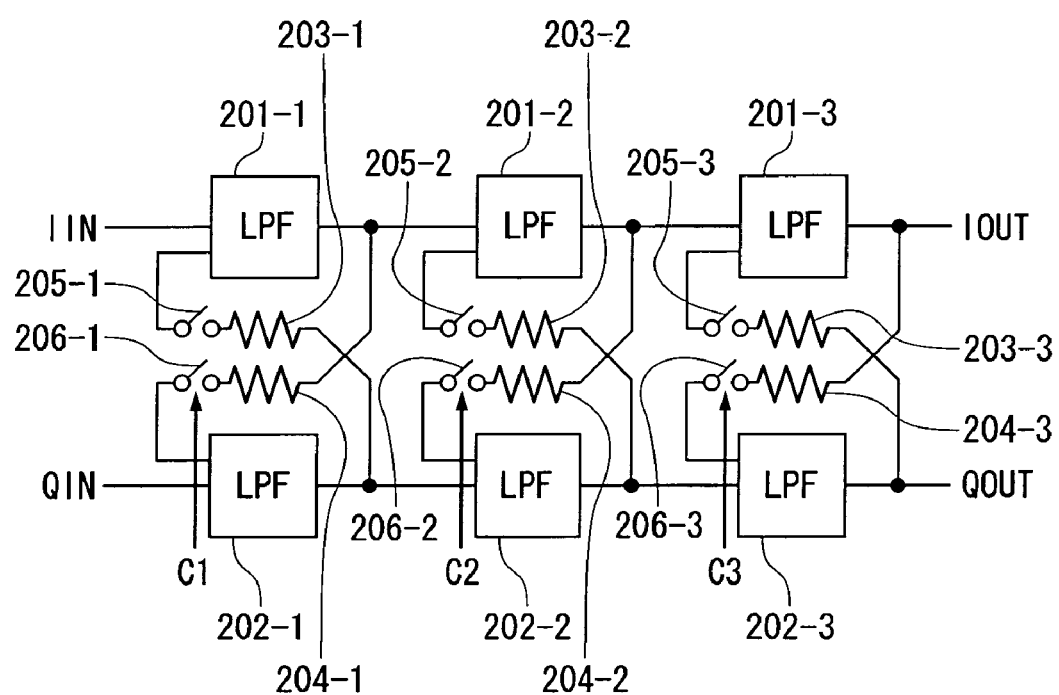
Figure 3:
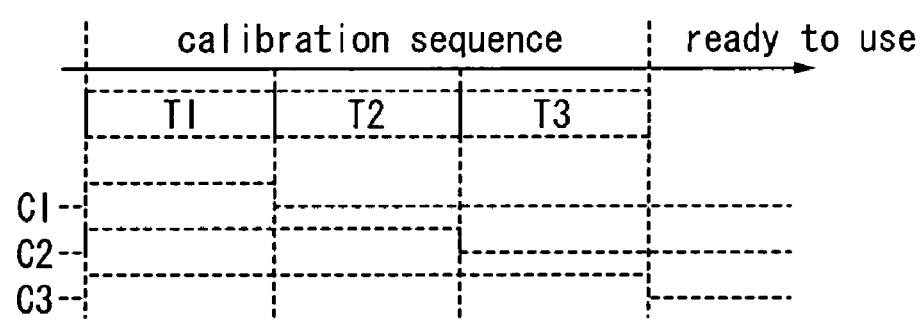
Figure 4:
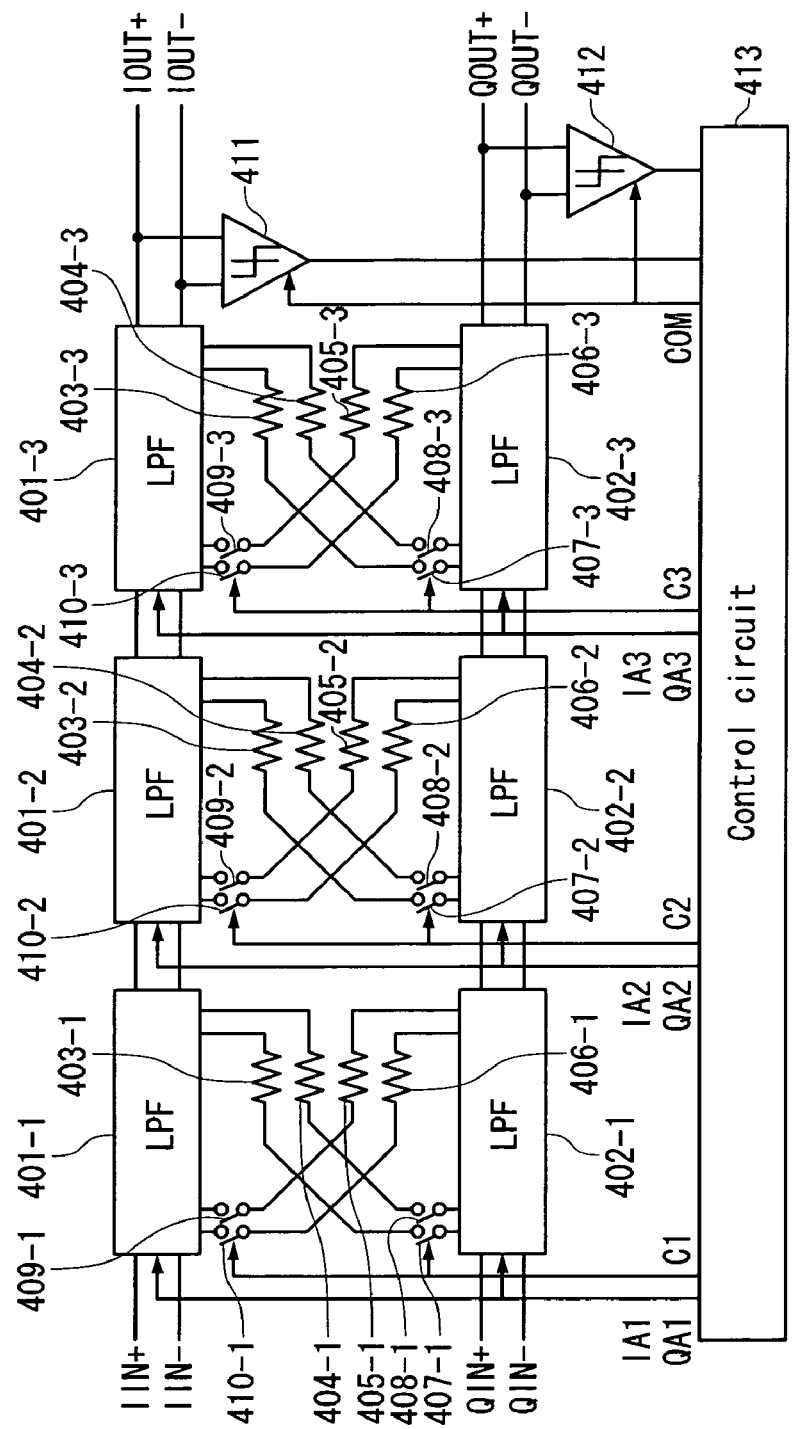
Figure 5:
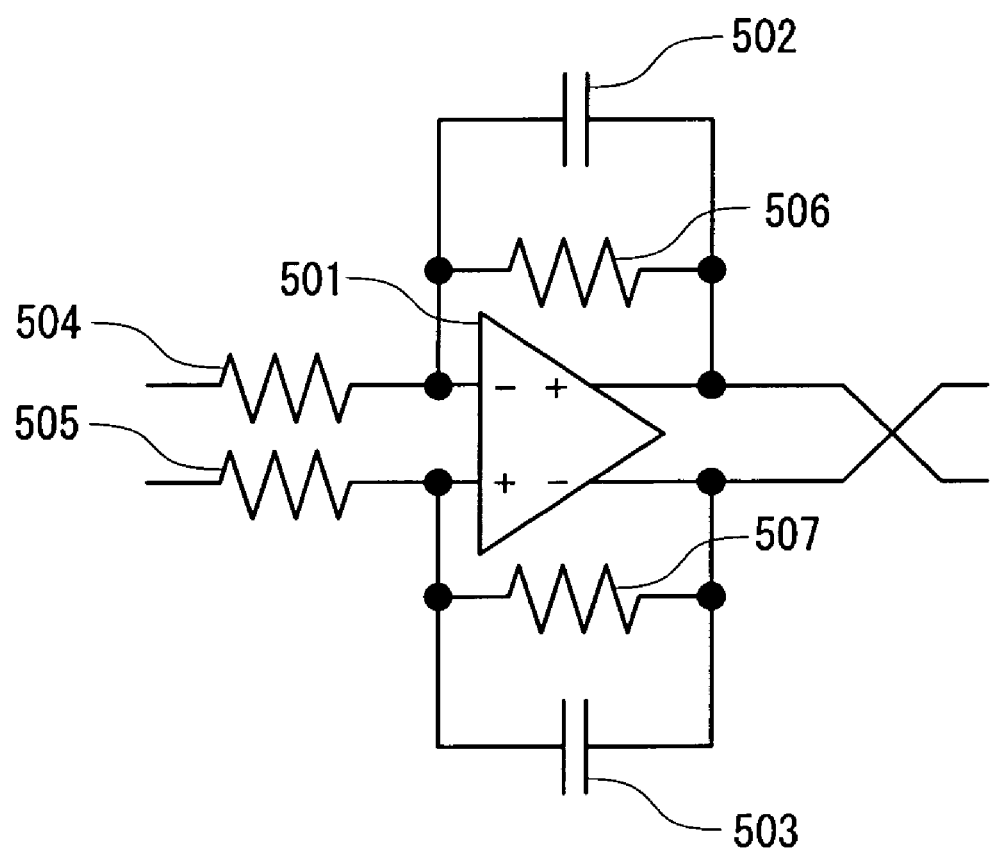
Figure 6:
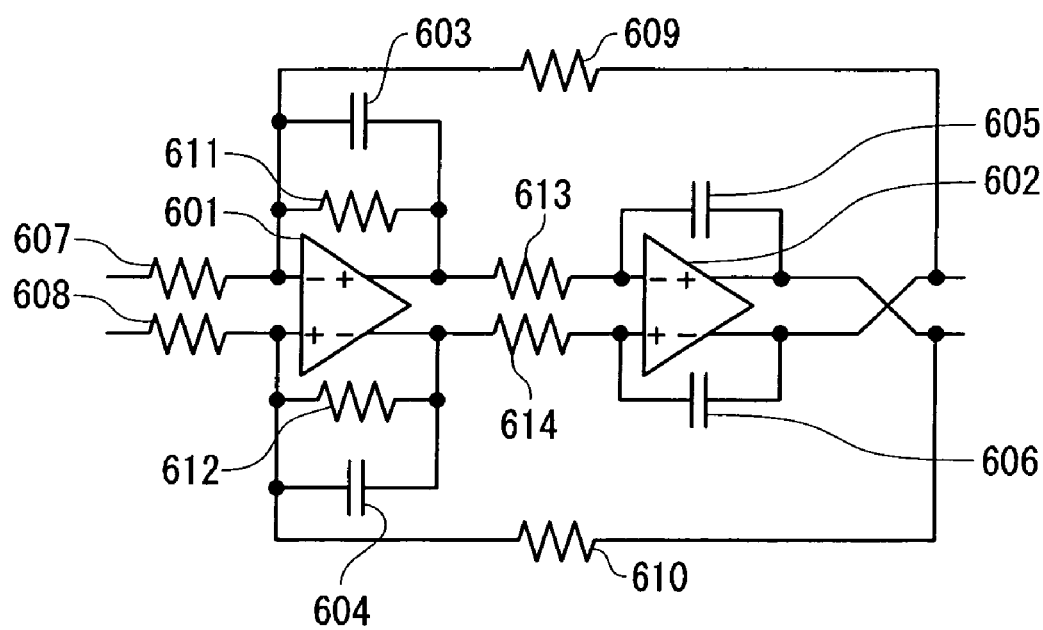
Figure 7:
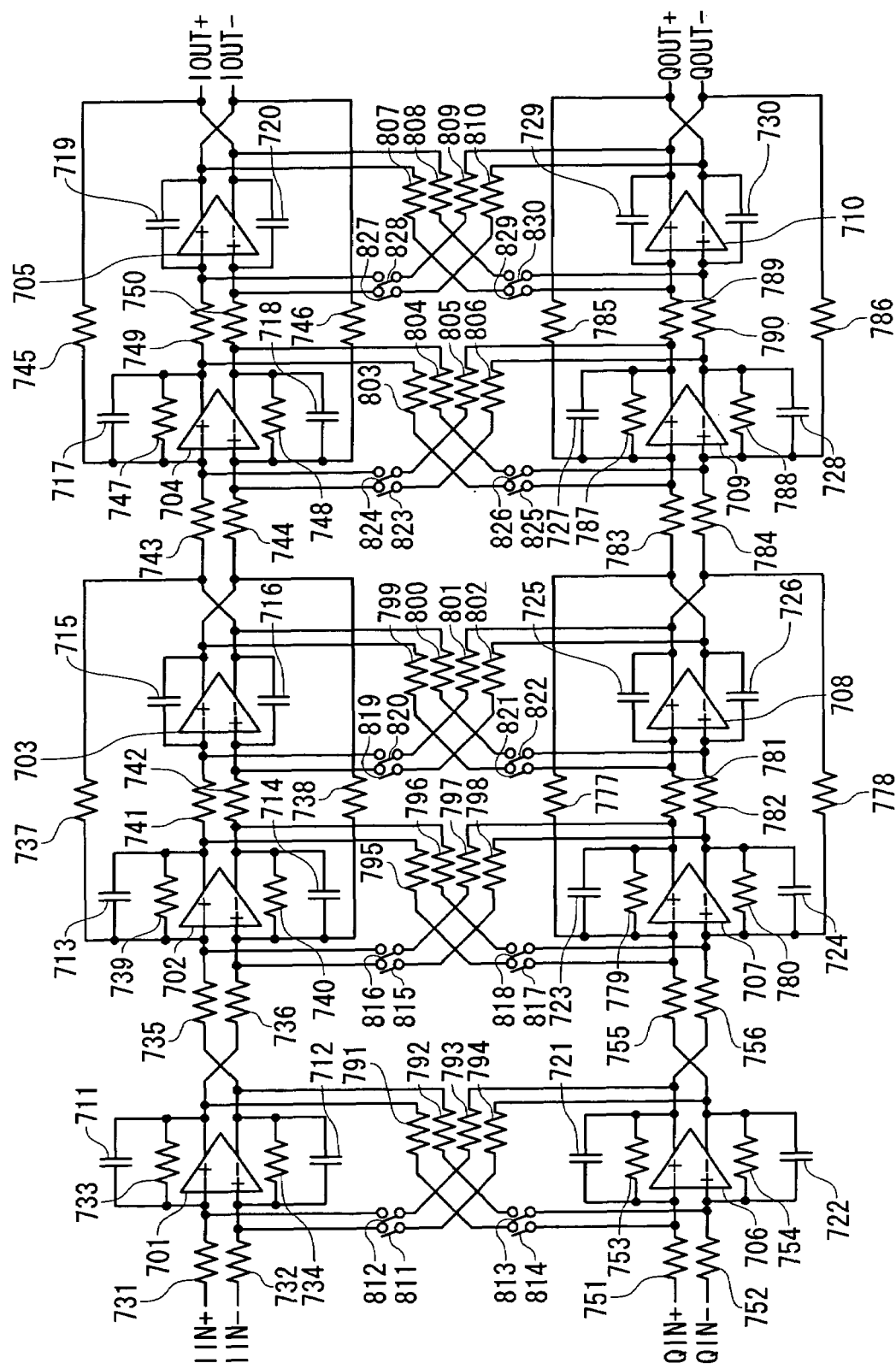
Figure 8:
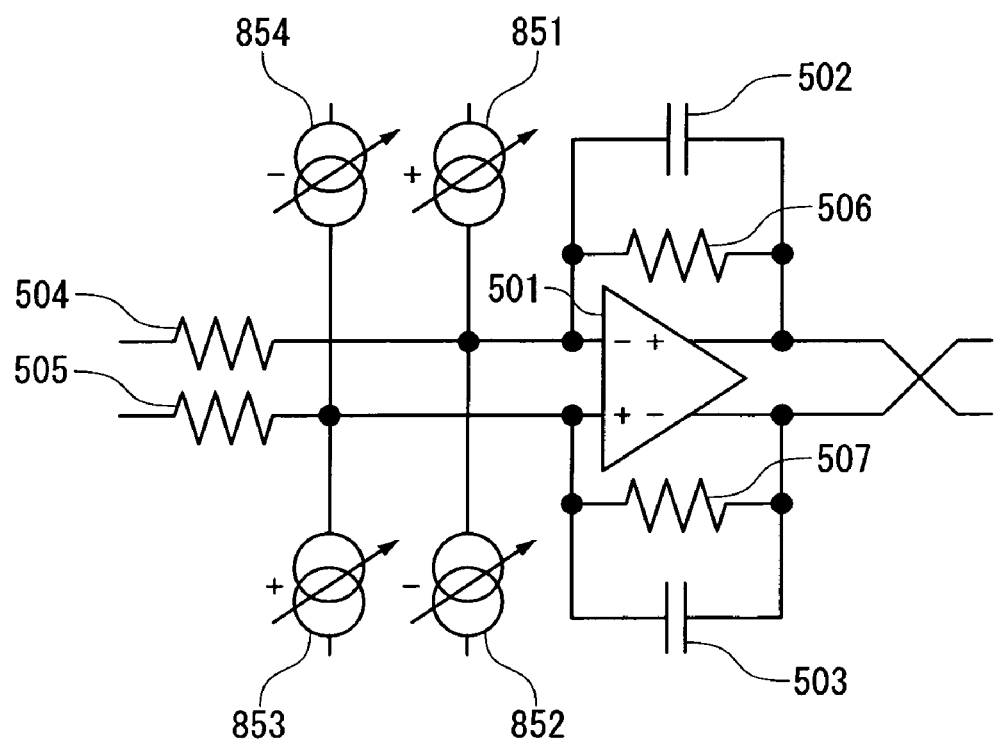
Figure 9:
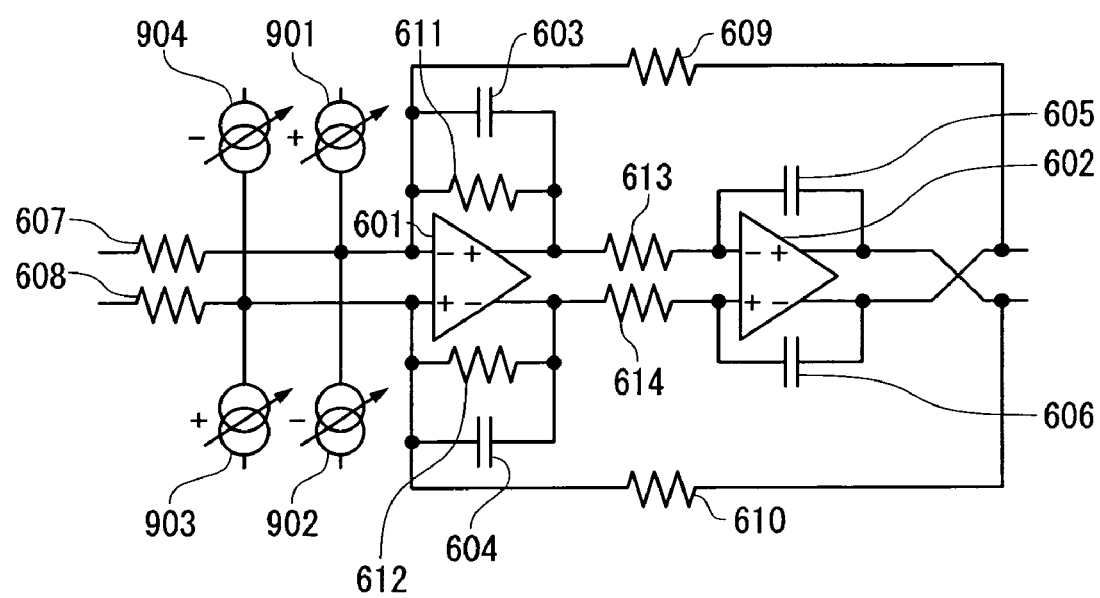
Figure 10:
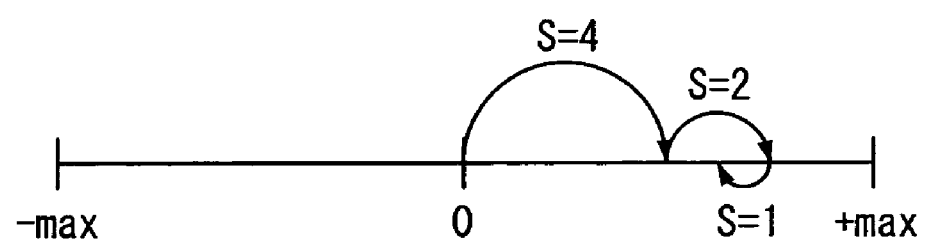
Figure 11:
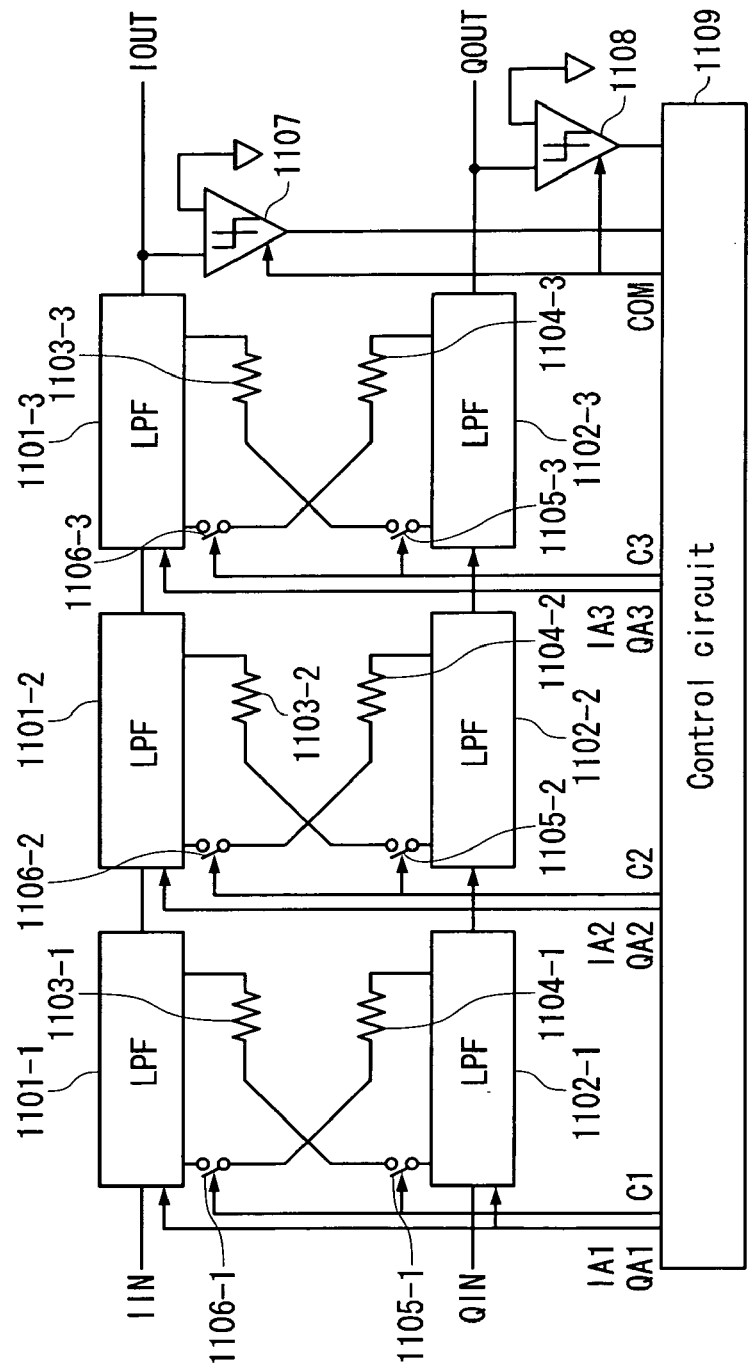
Figure 12:
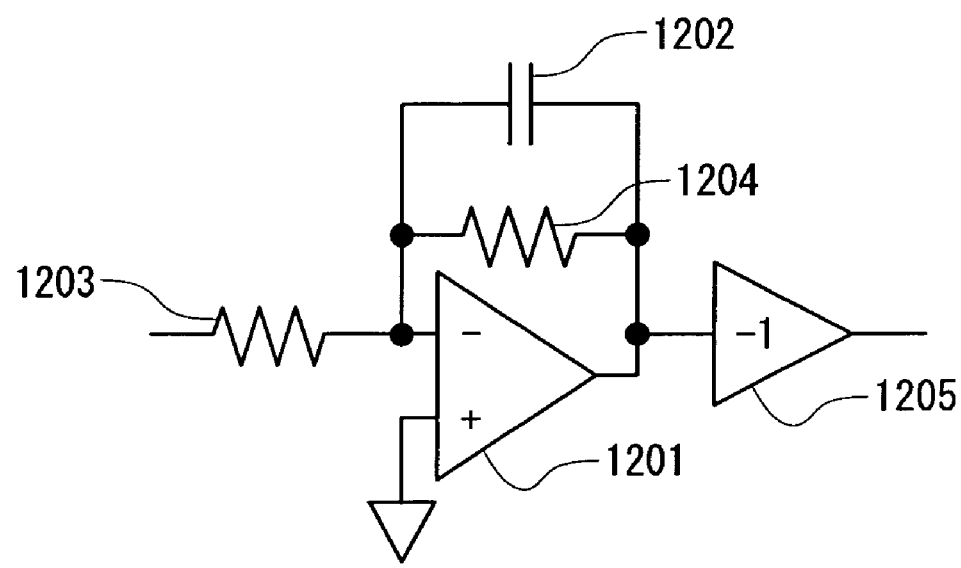
Figure 13:
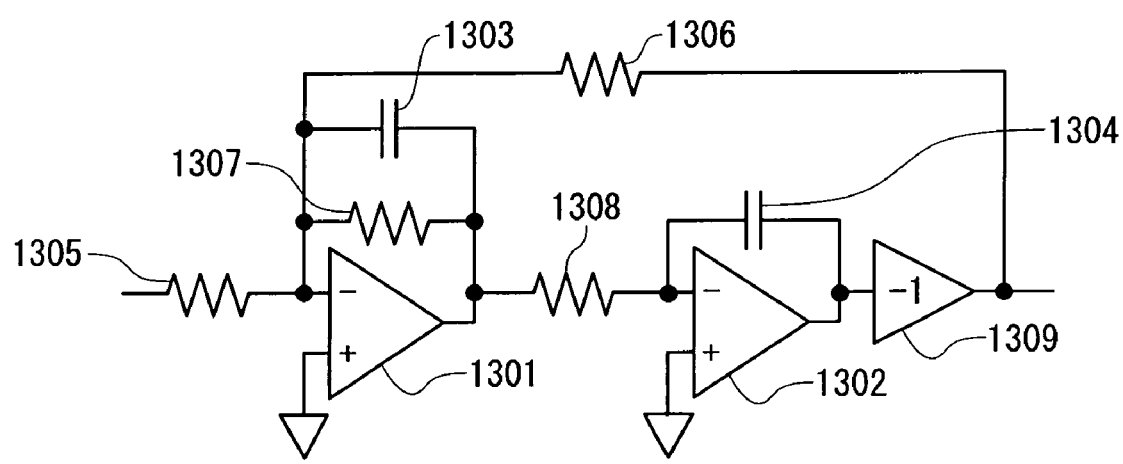
Figure 14:
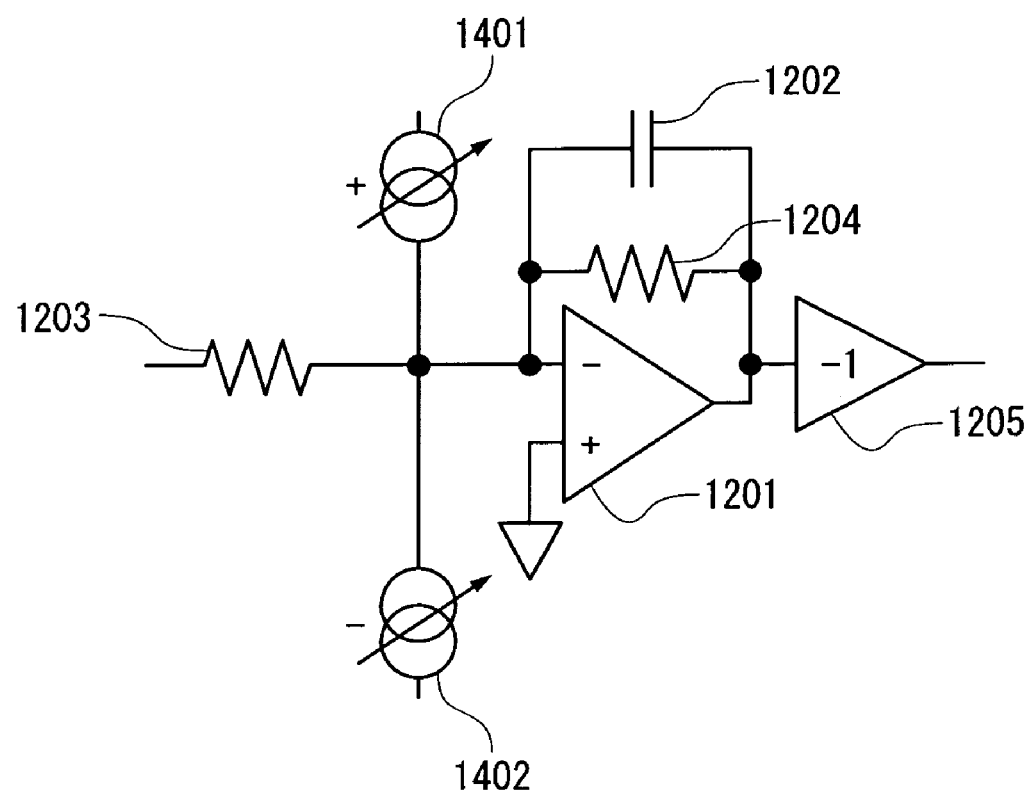
Figure 15:
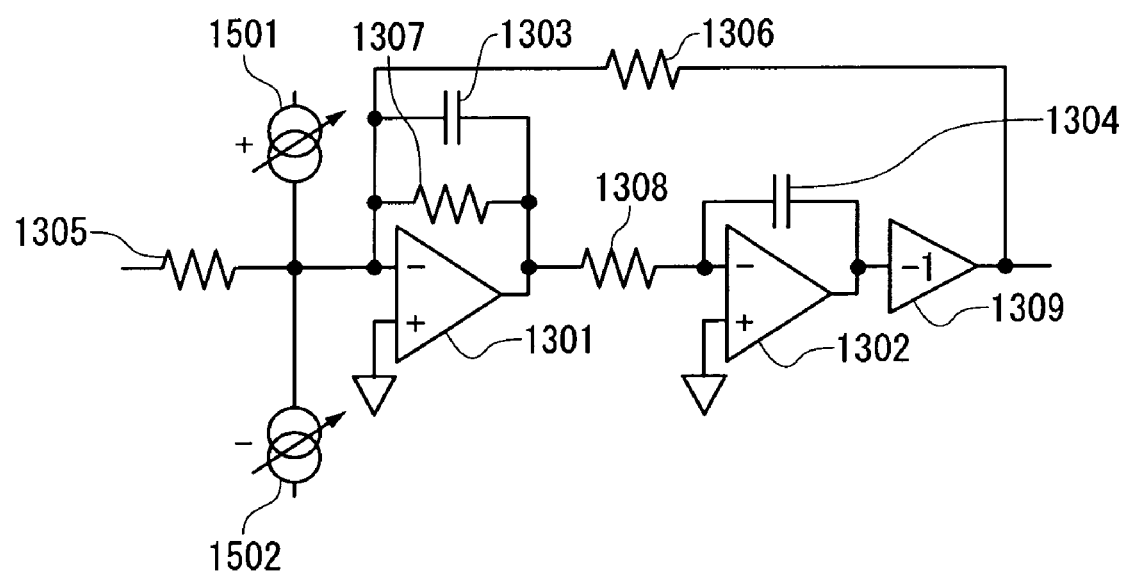
Figure 16:
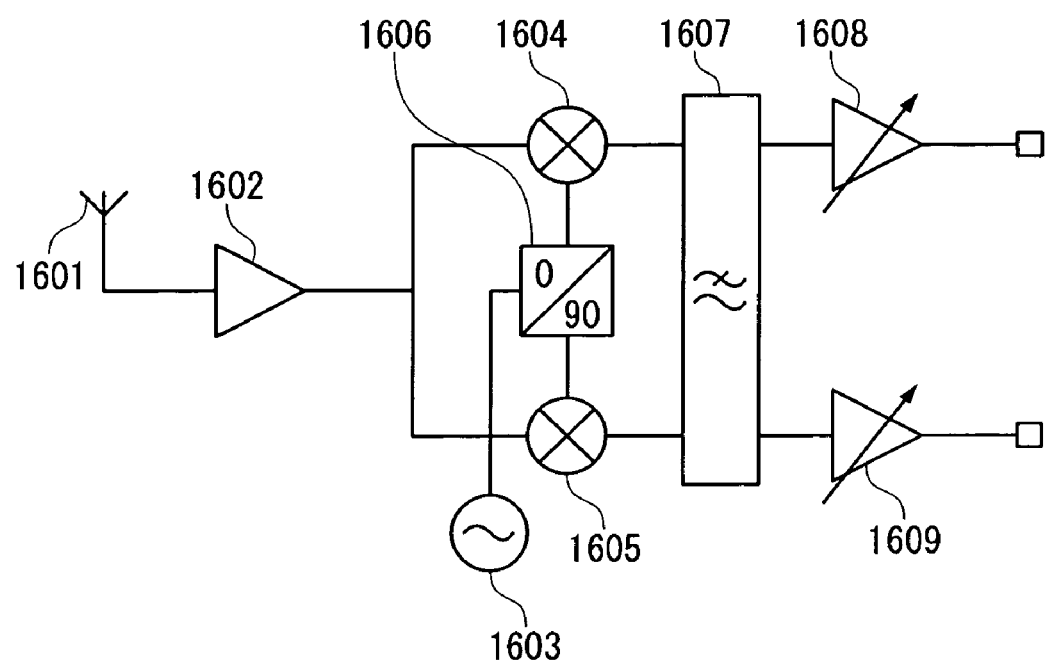

FIG. 1 is a principle diagram of a signal processing apparatus of the present apparatus.
FIG. 2 is a block diagram of a first complex filter.
FIG. 3 is a diagram showing a correction sequence.
FIG. 4 is a block diagram of a second complex filter.
FIG. 5 is a block diagram of a first low-pass filter.
FIG. 6 is a block diagram of a second low-pass filter.
FIG. 7 is a block diagram of a third complex filter.
FIG. 8 is a block diagram of a third low-pass filter.
FIG. 9 is a block diagram of a fourth low-pass filter.
FIG. 10 is a diagram showing a binary search.
FIG. 11 is a block diagram of a fourth complex filter.
FIG. 12 is a block diagram of a fifth low-pass filter.
FIG. 13 is a block diagram of a sixth low-pass filter.
FIG. 14 is a block diagram of a seventh low-pass filter.
FIG. 15 is a block diagram of an eighth low-pass filter.
FIG. 16 shows a configuration example of a radio receiver.

5. DETAILED DESCRIPTION OF THE EMBODIMENTS

FIG. 1 is a principle diagram of a signal processing apparatus of the present apparatus. The signal processing apparatus of FIG. 1 comprises filter stages 101-1 to 101-n (n☐2) of the number of n and a correction unit 102. Each filter stage includes a first filter 111 on an in-phase signal channel, a second filter 112 on a quadrature signal channel, said first filter 111 and said second filter which are connected to two signal paths, i.e., signal paths 113-1 and 113-2 which are crossing each other.

Moreover, at least more than one filter stage 101-i of the filter stages of the number of n include a switching circuit 114 disconnecting the signal paths 113-1 and 113-2. And, the correction unit 102 uses the switching circuit 114 to correct direct current offsets of the first filter 111 and the second filter 112 in the filter stage 101-i.

At first, the correction unit 102 controls the switching circuit 114 to disconnect the signal paths 113-1 and 113-2 in the filter stage 101-$i$ and corrects the direct current offset of the filter stage 101-$i$. After correcting the direct current offset, the correction unit 102 controls the switching circuit 114 to connect the signal paths 113-1 and 113-2 in the filter stage 101-$i$ and corrects the direct current offset of the filter stage following the filter stage 101-$i$.

FIG. 2 shows a configuration example of the complex filter of the present apparatus. The complex filter comprises low-pass filters 201-1 to 201-3 on the side of the I channel, low-pass filters 202-1 to 202-3 on the side of the Q channel, resistances 203-1 to 203-3, 204-1 to 204-3, and switches 205-1 to 205-3, 206-1 to 206-3.

The low-pass filters 201-1 to 201-3, 202-1 to 202-3 and the resistances 203-1 to 203-3, 204-1 to 204-3 have the same functions as those of low-pass filters 11-1 to 11-3, 12-1 to 12-3 and resistances 13-1 to 13-3, 14-1 to 14-3 of FIG. 17.

A switch 205-$n$ in a stage of n (n=1, 2, 3) is provided between an input terminal of a low-pass filter 201-$n$ and a resistance 203-$n$, and a switch 206-$n$ in a stage of n (n=1, 2, 3) is provided between the input terminal of a low-pass filter 202-$n$ and a resistance 204-$n$. The signal paths (a crossing signal path) crossing between the I channel and the Q channel can be disconnected by the switches 205-$n$ and 206-$n$.

An I signal IIN and a Q signal QIN are input into the low-pass filters 201-1 and 202-1, respectively. An I signal IOUT and a Q signal QOUT are output from the low-pass filters 201-3 and 202-3, respectively. Also, a control signal Cn of the stage of n is used as on/off control of the switches 205-$n$ and 206-$n$.

FIG. 3 shows an example of a correction sequence of DC offset in the complex filter of FIG. 2. In the correction sequence, the switches 205-1 to 205-3, 206-1 to 206-3 are turned off by setting control signals C1 to C3 of the complex filter to logical "1" during a period T1. Due to this, the crossing signal paths are all disconnected in the first stage to the third stage. Then, a control unit (not shown) corrects the DC offsets of the low-pass filters 201-1 and 202-1 of the first stage while the circuit (not shown) is monitoring output signals IOUT and QOUT of the complex filter (or the output signal of the first or second stage) in a no-signal state.

In the complex filter, the switches 205-1 and 206-1 are turned on by setting only the control signal C1 to logical "0" during a period T2. The complex filter connects the crossing signal paths in the first stage in which the correction is finished. Then, the control circuit (not shown) monitors the output signals IOUT and QOUT of the complex filter (or the output signal of the second stage) in the no-signal state and corrects the DC offsets of the low-pass filters 201-2 and 202-2 of the second stage.

The complex filter sets the control signals C1 and C2 in logical "0" during a period T3 and turns on the switches 205-1, 205-2, 206-1 and 206-2. By them, the crossing signal paths of the first and second stages are connected in the complex filter. Then, the control circuit (not shown) corrects the DC offsets of the low-pass filters 201-3 and 202-3 of the third stage while the control circuit (not shown) monitors the output signals IOUT and QOUT of the complex filter in the no-signal state.

In the complex filter, the crossing signal paths of all the stages are disconnected, so that the I channel and the Q channel become independent real filters. Thus, the control circuit (not shown) corrects the DC offset of the first stage while the circuit (not shown) monitors the output signals on each channel in the no-signal state.

Next, in the complex filter, the crossing signal path of the first stage is connected when the correction of the first stage is finished. Due to this, a remainder of the offsets of the first stage correctly interacts between the I channel and the Q channel in the same way the complex filter is actually operated. In the complex filter, correction of the second stage is performed in this state, so that correction including the remainder of the offset of the first stage is performed.

In the complex filter, the crossing signal path is connected in the previous stage in which the correction is finished and the corrections are sequentially performed in the first stage to the third stage. This makes it possible to accurately correct the DC offset in the same sequence as that of the real filter.

FIG. 4 shows a configuration example of the complex filter operated by differential signals. The complex filter comprises low-pass filters 401-1 to 401-3 on the side of the I channel, low-pass filters 402-1 to 402-3 on the side of the Q channel, resistances 403-1 to 403-3, 404-1 to 404-3, 405-1 to 405-3, 406-1 to 406-3, switches 407-1 to 407-3, 408-1 to 408-3, 409-1 to 409-3, 410-1 to 410-3, comparators 441 and 412, and a control circuit 413. The low-pass filters 401-$n$ and 402-$n$ of stage n of filters have the same configuration.

In this case, each of the I channel and the Q channel comprises a signal pass having a positive phase signal (□) and an inversion signal (□). The I signals IIN□ and IIN□ are input into the low-pass filter 401-1, and the I signals IOUT□ and IOUT□ are output from the low-pass filter 401-3. The signals IIN□ and IOUT□ are inverse signals of the signals IIN□ and IOUT□, respectively.

Also, the Q signals QIN□ and QIN□ are input into the low-pass filter 402-1, and the Q signals QOUT□ and QOUT□ are output from the low pass filter 402-3. The signals QIN□ and QOUT□ are inverse signals of the signals QIN□ and QOUT□, respectively.

Resistances 403-$n$ and 404-$n$ in the stage of n are provided between an output-side node of a low-pass filter 401-$n$ and an input-side node of a low-pass filter 402-$n$. Resistances 405-$n$ and 406-$n$ are provided between the output-side node of the low-pass filter 402-$n$ and the input-side node of the low-pass filter 401-$n$.

A switch 407-$n$ in stage n is provided between the input-side node of the low-pass filter 402-$n$ and the resistance 403-$n$, and a switch 408-$n$ is provided between the input-side node of the low-pass filter 402-$n$ and the resistance 404-$n$. A switch 409-$n$ is provided between the input-side node of the low-pass filter 401-$n$ and the resistance 405-$n$, and a switch 410-$n$ is provided between the input-side node of the low-pass filter 401-$n$ and the resistance 406-$n$.

The comparator 411 decides the sign of the difference between the signals IOUT□ and IOUT□ and outputs a signal indicating the sign to the control circuit 413. The comparator 412 determines the sign of the difference between the signals QOUT□ and QOUT□ and outputs the signal indicating the sign to the control circuit 413.

The control circuit 413 outputs the control signal Cn used to provide on/off control of the switches 407-$n$, 408-$n$, 409-$n$, and 410-$n$ of the stage of n and outputs a control signal COM indicating a decision timing to the comparators 411 and 412. Then, the control circuit 413 outputs a control signal IAn adjusting the DC offset of the low-pass filter 401-$n$ based on the signal output from the comparator 411, and outputs a control signal QAn adjusting the DC offset of the low-pass filter 402-$n$ based on the signal output from the comparator 412.

FIG. 5 shows a configuration example of each low-pass filter of FIG. 4. This low-pass filter comprises a differential amplifier circuit 501, capacitors 502 and 503, and resistances 504 to 507, and which operates as a first-order low-pass filter.

FIG. 6 shows another configuration example of each low-pass filter of FIG. 4. This low-pass filter comprises differential amplifier circuits 601 and 602, capacitors 603 to 606, and resistances 607 to 614, and which operates as a second-order low-pass filter.

In FIG. 4, two pairs of the crossing signal paths are provided in each stage, but more than one pairs of the crossing signal paths may be generally provided depending on an internal configuration of the low-pass filter. FIG. 7 shows a configuration example of such complex filter (a fifth-order low-pass filter).

This complex filter employs the first-order low-pass filter of FIG. 5 in the first stage, and employs the second-order low-pass filter of FIG. 6 in the second stage and third stage. However, comparators and control units are omitted.

This complex filter comprises differential amplifier circuits 701 to 710, capacitors 711 to 730, resistances 731 to 810, switches 811 to 830, and comparators (not shown) and control units (not shown) for the I channel and the Q channel.

The resistance 791 and the switch 813 of the first stage are provided between an output terminal (□) of the differential amplifier circuit 701 and the input terminal (□) of the differential amplifier circuit 706, and the resistance 792 and the switch 814 of the first stage are provided between the output terminal (□) of the differential amplifier circuit 701 and the input terminal (□) of the differential amplifier circuit 706.

The resistance 793 and the switch 812 of the first stage are provided between the output terminal (□) of the differential amplifier circuit 706 and the input terminal (□) of the differential amplifier circuit 701, and the resistance 794 and the switch 811 are provided between the output terminal (□) of the differential amplifier circuit 706 and the input terminal (□) of the differential amplifier circuit 701.

The resistance 795 and the switch 817 of the second stage are provided between the output terminal (□) of the differential amplifier circuit 702 and the input terminal (□) of the differential amplifier circuit 707, and the resistance 796 and the switch 818 of the second stage are provided between the output terminal (□) of the differential amplifier circuit 702 and the input terminal (□) of the differential amplifier circuit 707.

The resistance 797 and the switch 816 of the second stage are provided between the output terminal (□) of the differential amplifier circuit 707 and the input terminal (□) of the differential amplifier circuit 702, and the resistance 798 and the switch 815 of the second stage are provided between the output terminal (□) of the differential amplifier circuit 707 and the input terminal (□) of the differential amplifier circuit 702.

The resistance 799 and the switch 821 of the second stage are provided between the output terminal (□) of the differential amplifier circuit 703 and the input terminal (□) of the differential amplifier circuit 708, and the resistance 800 and the switch 822 of the second stage are provided between the output terminal (□) of the differential amplifier circuit 703 and the input terminal (□) of the differential amplifier circuit 708.

The resistance 801 and the switch 820 of the second stage are provided between the output terminal (□) of the differential amplifier circuit 708 and the input terminal (□) of the differential amplifier circuit 703, and the resistance 802 and the switch 819 of the second stage are provided between the output terminal (□) of the differential amplifier circuit 708 and the input terminal (□) of the differential amplifier circuit 703.

Connections of the resistances 803 to 810 and the switches 823 to 830 of the third stage are the same as those of the second stage.

FIG. 8 shows a configuration example of the first-order low-pass filter of FIG. 5 with an added correction circuit. In the configuration of this low-pass filter, variable current sources 851 and 852 are connected to an inverting input terminal (□) of a differential amplifier circuit 501, and variable current sources 853 and 854 are connected to an non-inverting input terminal (□).

A sign □/□ appended to the variable current sources 851 to 854 represents a current sign of a positive DC offset. In this low-pass filter, either of the □/□ variable current sources connected to each of the input terminals can be omitted. Their variable sources 851 to 854 are controlled by the control signal IAn or QAn output from the control circuit 413.

FIG. 9 shows a configuration example of the second-order low-pass filter of FIG. 6 with the added correction circuit. In this configuration, variable current sources 901 and 902 are connected to the inverting input terminal (□) of a differential amplifier circuit 601, and variable current sources 903 and 904 are connected to the non-inverting input terminal (□) of the differential amplifier circuit 601. The operations of variable current sources 901 to 904 are the same as those of the variable current sources 851 to 854 of FIG. 8.

Next, an example of correction operation of the DC offset in the complex filter of FIG. 4 will be described. The correction of the DC offset is performed before or after the operation of inputting the signal into the complex filter instead of during the actual operation.

The correction circuit of each low-pass filter has correction values with fifteen steps, i.e., □7 to □7, and provides the offset in dependence on the correction value. And, the low-pass filter of each stage has a voltage gain of four times. Other values can be used since these assumptions are illustrative only. The correction operation in this case is performed as follows:

1. The control circuit 413 sets input signals IIN□ and IIN□ of the I channel to a zero state (shorted). In the same way, the control circuit 413 also sets the input signals QIN□ and QIN□ of the Q channel to the zero state. Then, the control circuit 413 resets all the correction values of each stage to "0" by outputting the control signals IAn and QAn, and turns off all the switches of each stage by outputting the control signal Cn.

2. The control circuit 413 sequentially performs procedures 3 to 7 for each stage as follows. First, the procedure 3 is performed with n=1.

3. The control circuit 413 starts performing correction of the stage of n. At this time, a correction value Dn (□7 to □7) of the stage n is reset to "0" by the procedure 1. The control circuit 413 sets "4" for a step value S. The value "4" corresponds to the value rounding up of half of "7" indicating the upper limit of the correction value Dn of the stage of n.

4. The control circuit 413 outputs the control signal COM, such as a pulse, to the comparators 411 and 412. The comparators 411 and 412 decide the signs of the output signals of the I channel and the Q channel, respectively. The comparator 411 outputs the sign of (IOUT□)□(IOUT□). The comparator 412 outputs the sign of (QOUT□)□(QOUT□).

5. The control circuit 413 sets the correction value Dn of the low-pass filter 401-n to Dn□S by outputting the control signal IAn if the sign output from the comparator 411 is "□". The control circuit 413 sets the correction value Dn of the low-pass filter 401-n to Dn□S if the sign output from the comparator 411 is "□". In the same way, the control circuit 413 sets the correction value Dn of the low-pass filter 402-n to Dn□S by outputting the control signal QAn if the sign output from the comparator 412 is "□". The control circuit 413 sets the correction value Dn to Dn□S if the sign output from the comparator 412 is "□".

6. The control circuit 413 sets S to S□2, but discards the fractions. If not S=0, the procedure 4 is repeated. If S=0, the correction of the stage of n is finished, and the procedure 7 is then performed.

7. The control circuit 413 turns on all the switches of the stage of n by outputting the control signal Cn. If not n□3, the control circuit 413 sets n□1 for n and repeats next procedures after the procedure 3. If n□3, the corrections of all the stages are considered to be finished, so that the procedure 8 is then performed.

8. The control circuit 413 cancels the zero state of the input signal of the I channel and the Q channel. According to the correction operation, the complex filter resets the adjusting amount of the offset in each stage to "0" by the procedure 1. Thus, the complex filter is made to be prepared for correction. Then, correction of each stage is sequentially performed by the procedures 3 to 7 from the first stage in the complex filter.

In each stage, a search range of the targeted correction value is narrowed by gradually breaking down the accuracy of the correction value (step value) using binary search. A correction value is considered when a complex filter has the offset of "□" if the sign of the output signal is "□", so that the correction value is changed to negative direction. The correction value is changed to the opposite direction if the sign of the output signal is "□".

After the correction value is changed as described above, the sign of the output signal is checked again in this state and the correction value is changed. However, at this time, half of the step value of the previous change is applied. These repeating operations correspond to the procedures 4 to 6, thereby performing the binary search. For example, if the comparator continuously outputs the signs "□", "□" and "□", the change amounts of the correction values become "□4", "□2" and "□1" as shown in FIG. 10.

The offset correction of the present stage is finished if the step value is "0" (procedure 7). And, the correction value adjusting the offset of the output signal to be as close to zero as possible is set as the correction value in this stage. In this state, there is a small error in the output signal. However, the error of the output signal is changed to that of the complex filter connecting the crossing signal path by turning on the switches in the crossing signal path in the procedure 7. However, the size of the error after switching is almost the same as that of the error before switching.

In this state, the control circuit acquires the correction value adjusting the offset of output signal to be close to zero with more precise accuracy by performing the procedures 3 to 7 in this state for the next stage. If each stage has a gain (e.g., a four-time gain: 12 dB), an error of the stage is amplified in the following stage. Therefore, adjustment in the stage near the head seems to be a big step (coarse adjustment) at the end, and adjustment in the stage near the end seems to be a small step (fine adjustment). Thus, the correction values are set with more precise accuracy in accordance with subsequent steps.

When the adjustments of all the stages are finished (procedure 8), the correction value of each stage adjusting the offset of the output signal to be as close to zero as possible can be obtained in the state where the complex filter is configured.

The above-described correction sequence is also applicable to the complex filter operated by single-ended signals. FIG. 11 shows a configuration of the complex filter operated by the single-ended signals.

The complex filter comprises low-pass filters 1101-1 to 1101-3 on the side of the I channel, low-pass filters 1102-1 to 1102-3 on the side of the Q channel, resistances 1103-1 to 1103-3, 1104-1 to 1104-3, switches 1105-1 to 1105-3, 1106-1 to 1106-3, comparators 1107 and 1108, and a control unit 1109. Of these, low-pass filters 1101-$n$ and 1102-$n$ of stage n of the filters have the same configuration.

The I signal IN and the Q signal QIN are input into the low-pass filters 1101-1 and 1102-1, respectively. The I signal IOUT and the Q signal QOUT are output from the low-pass filters 1101-3 and 1102-3, respectively.

A resistance 1103-$n$ of stage n is provided between the output-side node of the low-pass filter 1101-$n$ and the input-side node of the low-pass filter 1102-$n$. A resistance 1104-$n$ is provided between the output-side node of the low-pass filter 1102-$n$ and the input-side node of the low-pass filter 1101-$n$.

A switch 1105-$n$ of stage n is provided between the input-side node of the low-pass filter 1102-$n$ and the resistance 1103-$n$. A switch 1106-$n$ is provided between the input-side node of the low-pass filter 1101-$n$ and the resistance 1104-$n$.

The comparator 1107 decides the sign of the difference between the signal IOUT and a signal ground (a reference potential of the analog signal) and outputs the signal indicating the sign to the control circuit 1109. The comparator 1108 decides the sign of the difference between the signal QOUT and the signal ground and outputs the signal indicating the sign to the control circuit 1109.

The control circuit 1109 outputs the control signal Cn used to provide on/off control of the switches 1105-$n$ and 1106-$n$ of stage n, and outputs the control signal COM indicating the determination timing to the comparators 1107 and 1108. Then, the control circuit 1109 outputs the control signal IAn adjusting the DC offset of the low-pass filter 1101-$n$ based on the signal output from the comparator 1107, and outputs the control signal QAn adjusting the DC offset of the low-pass filter 1102-$n$ based on the signal output from the comparator 1108.

FIG. 12 shows a configuration example of each low-pass filter of FIG. 11. This low-pass filter comprises an amplifying circuit 1201, a capacitor 1202, resistances 1203 and 1204, and an inverting buffer 1205, and operates as a first-order low-pass filter. The inverting buffer 1205 corresponds to a crossing of the two output signal lines in the low-pass filter of FIG. 5.

FIG. 13 shows another configuration of each low-pass filter of FIG. 11. This low-pass filter comprises amplifying circuits 1301 and 1302, capacitors 1303 and 1304, resistances 1305 to 1308, and an inverting buffer 1309 that operates as a second-order low-pass filter.

FIG. 14 shows a configuration example of the first-order low-pass filter of FIG. 12 including the correction circuit. This configuration shows that variable current sources 1401 and 1402 are connected to the inverting input terminal (□) of the amplifying circuit 1201. The variable current sources 1401 and 1402 are controlled by the control signal IAn or QAn output from the control circuit 1109. In this low-pass filter, either of the two variable current sources can be omitted.

FIG. 15 shows a configuration example of the second-order low-pass filter of FIG. 13 including the correction circuit. This configuration shows that variable current sources 1501 and 1502 are connected to the inverting input terminal (□) of the amplifying circuit 1301. The operation of the variable current sources 1501 and 1502 are the as same as those of the variable current sources 1401 and 1402 of FIG. 14.

FIG. 16 shows a configuration example of a radio receiver using the above-mentioned complex filter of FIG. 4. This radio receiver comprises an antenna 1601, a low-noise amplifier 1602, a synthesizer 1603, mixers 1604 and 1605, a phase shifter 1606, a complex filter 1607, and variable gain amplifiers 1608 and 1609.

The low-noise amplifier 1602 amplifies a radio frequency (RF) signal received by the antenna 1601, and outputs it to the mixers 1604 and 1605. The phase shifter 1606 produces two local signals, shifted by 90 degrees from each other, from the signals generated by the synthesizer 1603. The mixers 1604 and 1605 mix the output signal of the low-noise amplifier 1602 and the local signal respectively, generate a complex signal of an intermediate frequency band and output the complex signal to the complex filter 1607.

This complex signal is filtered by the complex filter 1607, which is output through the variable gain amplifiers 1608 and 1609. An analog/digital converter converts the output IF signal to a digital signal, transfers the digital signal to a digital baseband processing circuit.

The complex filter may be used in other apparatus such as a radio transmitter as well as the radio receiver.

Although a complex filter comprising three stages was described in the above embodiment, it is generally possible to apply the present invention to a complex filter comprising more than one stage.

There is no need to provide the switches in all the stages to disconnect the crossing signal paths. The switch has only to be provided in at least more than one stage. Also, the comparator may be added to more than one stage having the head to the end so as to monitor the output signals of the other stage.

What is claimed is:

1. A signal processing apparatus, comprising:
    a plurality of first filters on an in-phase signal channel;
    a plurality of second filters on a quadrature signal channel;
    a plurality of filter stages having each of more than one signal paths crossing each other which connects a corresponding first filter and a corresponding second filter via a switching circuit; and
    a correction circuit to correct direct current offsets of the first filter and the second filter in a first filter stage included in the plurality of filter stages by using the switching circuit and to correct direct current offsets of the first filter and the second filter in a second filter stage following the first filter stage included in the plurality of filter stages after correcting the first filter and the second filter in the first filter stage.

2. The signal processing apparatus according to claim 1, wherein the correction circuit controls the switching circuit to disconnect more than one signal paths of the first filter stage, and corrects the direct current offset of the first filter stage, and controls the switching circuit after the correction so as to connect more than one signal paths of the first filter stage, and corrects the direct current offset of the second filter stage.

3. The signal processing apparatus according to claim 1, wherein the first filter stage is a leading filter stage in the plurality of filter stages which are cascade-connected.

4. The signal processing apparatus according to claim 1, including a monitor circuit monitoring output signals of one filter stage of the plurality of the filter stages, and a control circuit determines a correction value of the direct current offset of a filter stage located before the one filter stage depending on the monitored output signal.

5. A signal processing apparatus, comprising:
    a plurality of filter stages, each of the plurality of filter stages includes:
    a first filter in an in-phase signal channel;
    a second filter in a quadrature channel;
    more than one signal paths crossing each other and connecting the first filter to the second filter;
    a switching circuit disconnecting more than one of the signal paths; and
    a correction circuit correcting direct current offsets of the first filter and the second filter by using the switching circuit after correcting direct current of filters in the other filter stage included in the plurality of filter stages and connecting the filters.

6. The signal processing apparatus according to claim 5, wherein the correction circuit controls the switching circuit to disconnect more than one of the signal paths, and correct direct current offsets of the first filter and the second filter.

7. A correction method for correcting direct current offsets of a plurality of filter stages in a signal processing apparatus, comprising:
    performing by the signal processing apparatus operations of:
    connecting a first filter on the in-phase signal channel with a second filter on the quadrature signal channel, the first filter and the second filter being included in a first filter stage of the plurality of filter stages;
    disconnecting more than one signal paths crossing each other included in the first filter stage;
    correcting the direct current offset of the first filter stage;
    connecting more than one of the signal paths of the first filter stage after the correction; and
    correcting direct current offset of a first filter and a second filter included in a second filter stage of the plurality of filter stages following the first filter stage.

\* \* \* \* \*